United States Patent
Chen

[11] Patent Number: 5,993,235
[45] Date of Patent: Nov. 30, 1999

[54] EJECTOR DEVICE FOR AN ELECTRICAL CONNECTOR

[75] Inventor: Victor Chen, Taipei, Taiwan

[73] Assignee: Hon Hai Precision Inc. Co., Ltd., Taipei Hsien, Taiwan

[21] Appl. No.: 08/940,436

[22] Filed: Sep. 30, 1997

[30] Foreign Application Priority Data

Nov. 18, 1996 [TW] Taiwan ................................. 85217751

[51] Int. Cl.$^6$ ................................................. H01M 13/62
[52] U.S. Cl. .......................... 439/326; 439/372; 439/157
[58] Field of Search ........................... 439/152, 153, 439/154, 155, 156, 157, 158, 159, 160, 325, 326, 327, 328, 329, 341, 372

[56] References Cited

U.S. PATENT DOCUMENTS 5,470,242  11/1995  Cheng et al. ........................... 439/157
5,676,561  10/1997  Chiang ................................... 439/328

*Primary Examiner*—Lincoln Donovan

[57] ABSTRACT

An ejector device for an electrical connector having an insulating housing defining a longitudinal is disclosed. The ejector device comprises a positioning structure formed on an end of the insulating housing and an ejector lever pivotably provided in the positioning structure. The ejector lever includes an upper pushing plate, a lower ejecting arm extending downward from a lower end of the pushing plate, and a pair of support arms extending downward of both lateral edges of the pushing plate and formed integrally with inward lateral edges of the ejecting arm for pivotably supporting the ejector lever relative to the positioning structure. An electrical connector including such an ejector device is also disclosed.

7 Claims, 4 Drawing Sheets

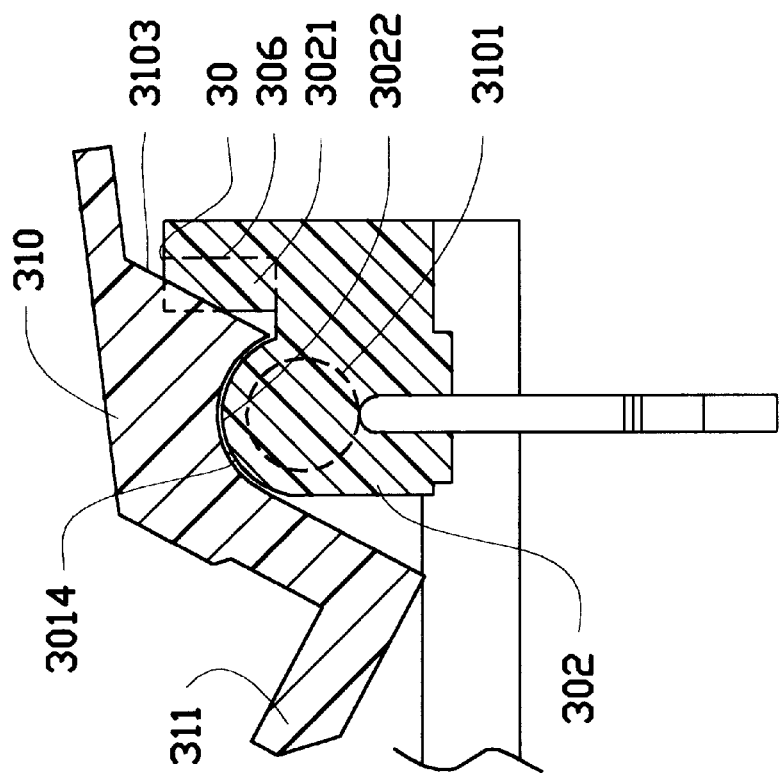
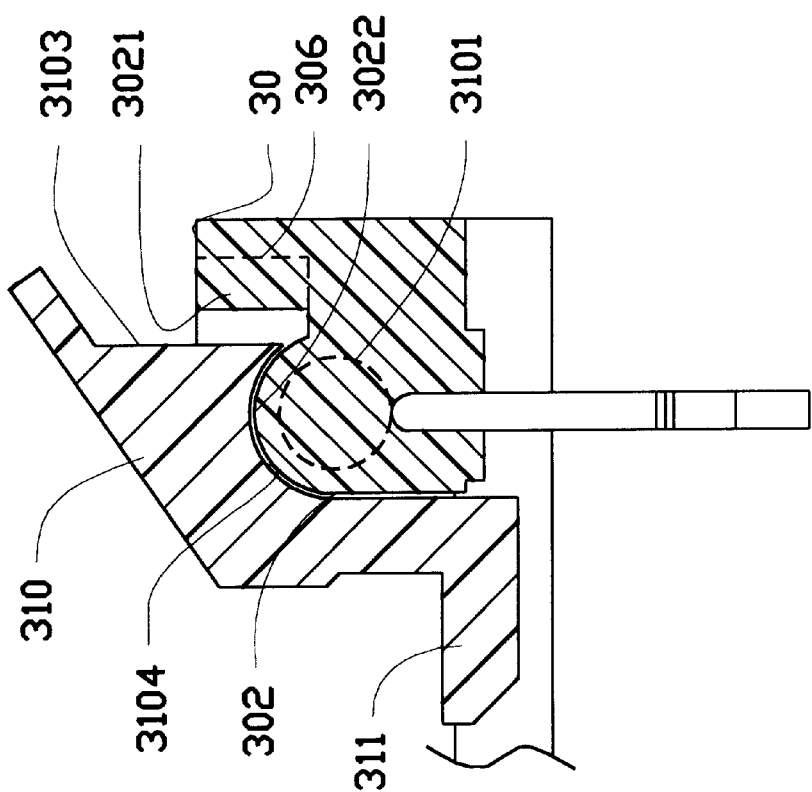

EJECTOR DEVICE FOR AN ELECTRICAL CONNECTOR

BACKGROUND OF THE INVENTION

1. Field of The Invention

The invention relates to an ejector device, more particular to an ejector device for an electrical connector.

2. The Prior Art

An ejector device is provided on an electrical connector for a mother board to eject a daughter board inserted therein for facilitating removal of the daughter board from the connector. Some conventional ejector device for an electrical connector are proposed in, for example, Taiwan Patent Application Nos. 81211475, 81212446, 81215780, 81216903, 83207437, 83213348 and 83217184, and U.S. Pat. Ser. Nos. 4,898,540, 4,975,073, 5,074,800, 5,106,315, 5,211,568, 5,302,133, 5,364,288 and 5,443,394. Some of these ejectors device, such as Taiwan Patent Application No. 81215780 and 83213348, and U.S. Pat. Ser. No. 5,443,394 have the problem that pivotal means of the respective ejector devices decreases the strength of both the ejector devices itself and the insulating housing of the electrical connector. The others of the above-mentioned ejector devices either have the problem that a pivotal shaft of the ejector device is liable to escape from pivotal holes formed on the insulating housing of the electrical connector or that a pushing lever is liable to break due to low strength thereof.

Hence, there is a need for an ejector device for an electrical connector which can overcome the mentioned-above problems of the conventional ejector devices.

SUMMARY OF THE INVENTION

Accordingly, one object of the present invention is to provide an ejector device of enhanced strength for an electrical connector.

Another object of the present invention is to provide an ejector device for an electrical connector, which ejector device increases the strength of the electrical connector when the ejector device is completely assembled to the electrical connector.

Still another object of the present invention is to provide a durable ejector device for an electrical connector, which ejector device can be smoothly operated.

To fulfill the above-mentioned object, according to one embodiment of the present invention, an ejector device for an electrical connector having an insulating housing comprises a positioning structure formed on an end of the insulating housing and an ejector lever pivotably provided in the positioning structure. The ejector lever includes an upper pushing plate, a lower ejecting arm extending downward from a lower end of the pushing plate, and a pair of support arms extending downward of both lateral edges of the pushing plate and formed integrally with inward lateral edges of the ejecting arm for pivotably supporting the ejector lever relative to the positioning structure.

In one aspect, an electrical connector according to the invention comprises an elongate insulating housing defining a central slot extending along a longitudinal direction thereof; a plurality of conductive contacts received in a plurality of passageway defined in the insulating housing; a positioning structure formed on an end of the insulating housing; and at least one ejector device provided on a longitudinal end of the housing including an upper pushing plate, a lower ejecting arm extending downward from a lower end of the pushing plate, and a pair of support arms extending downward of both lateral edges of the pushing plate and formed integrally with inward lateral edges of the ejecting arm for pivotably supporting the ejector lever relative to the positioning structure.

These and additional objects, features, and advantages of the present invention will be apparent from a reading of the following detailed description of the embodiments of the invention taken in conjunction with the appended drawing figures, which are described briefly immediately below.

BRIEF DESCRIPTION OF THE DRAWINGS

FIGS. 2A and 2B are partially cut-away cross-sectional views of the ejector device according to the present invention, showing different relative positions of the ejector lever to the positioning structure.

DETAILED DESCRIPTION OF THE PREFERRED EMBODIMENTS

Figure 1A:
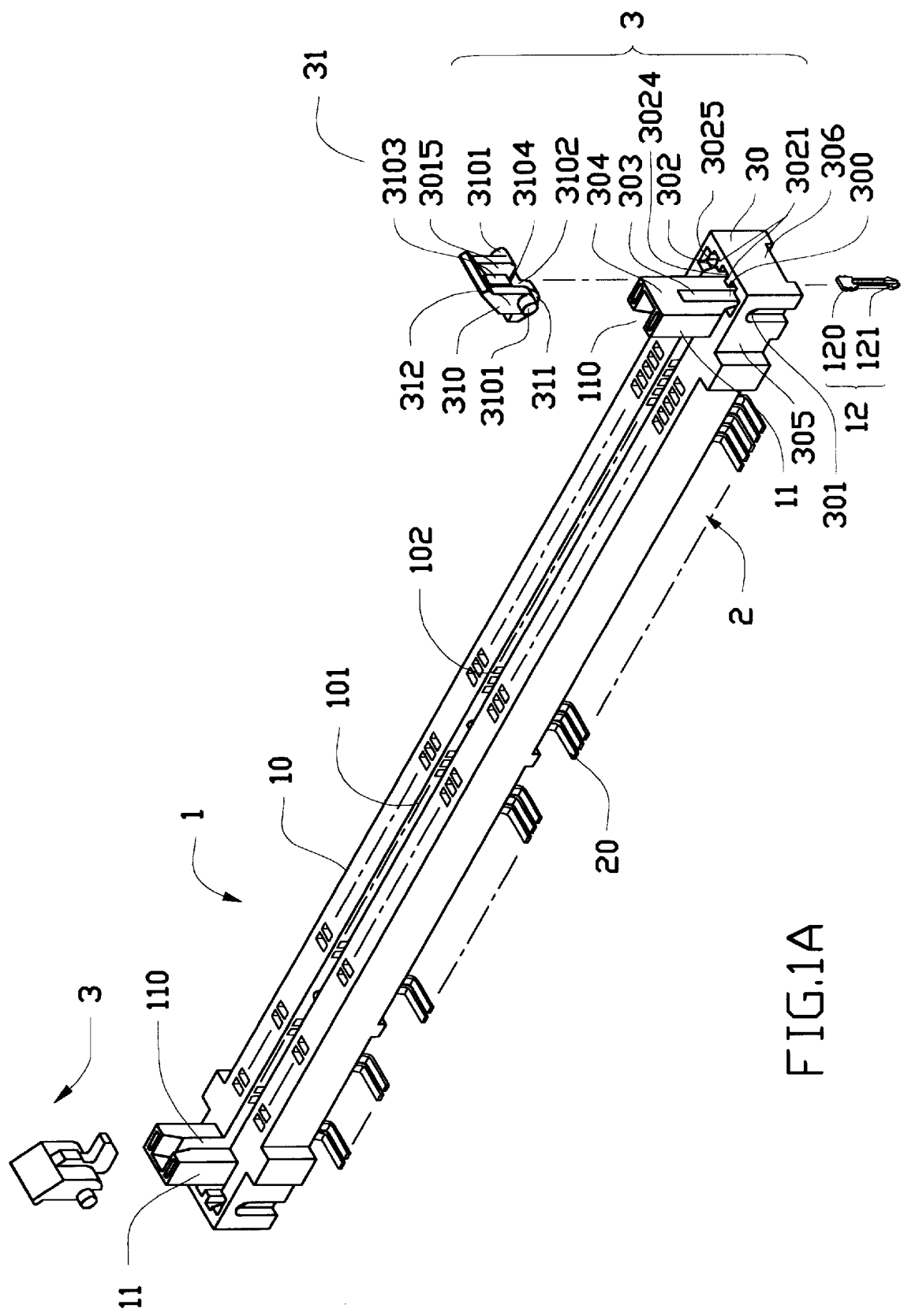
FIG. 1A shows an exploded perspective view of the ejector device and the associated connector according to a preferred embodiment of the present invention.
Figure 1B:
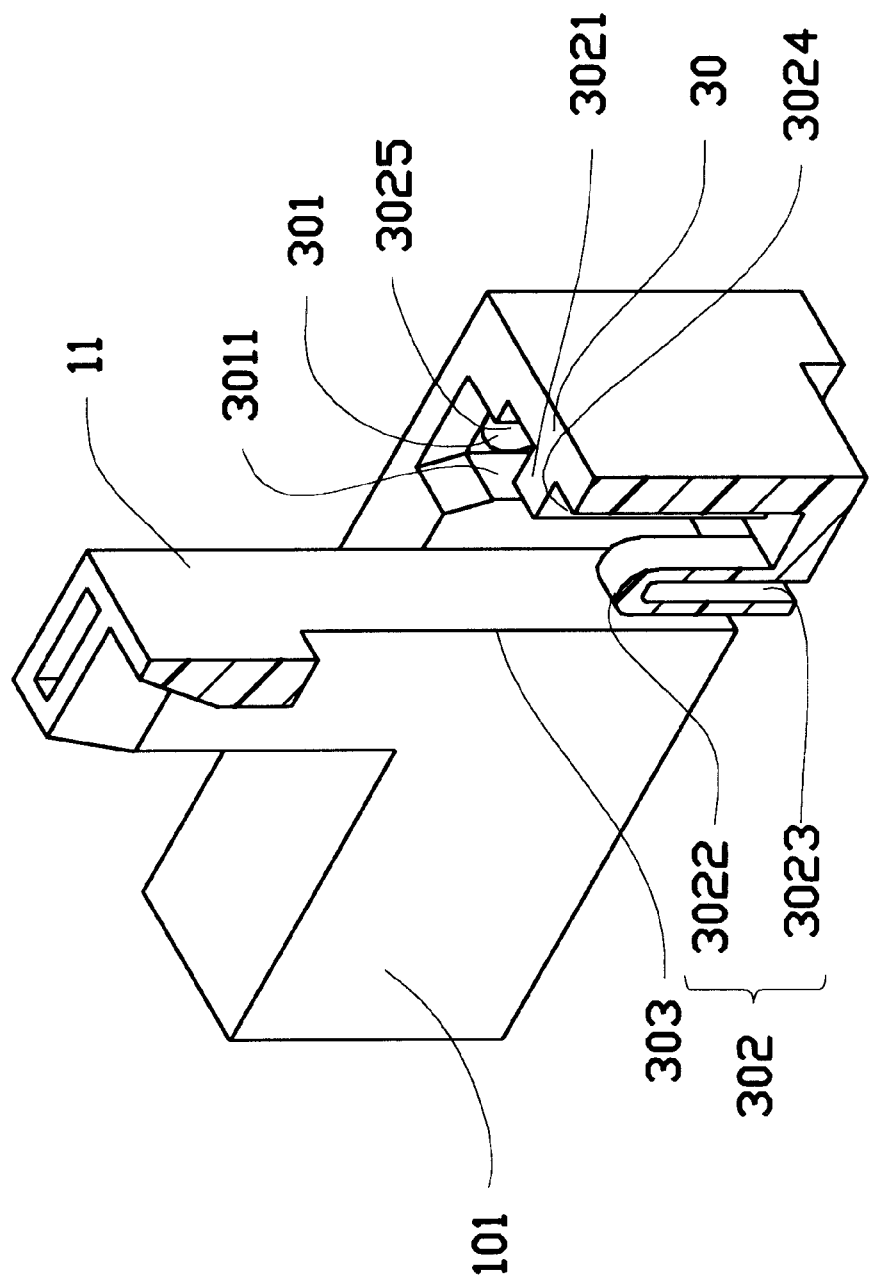
FIG. 1B shows a partially cut-away perspective view of the positioning structure of the ejector device shown in FIG. 1A.
Figure 3:
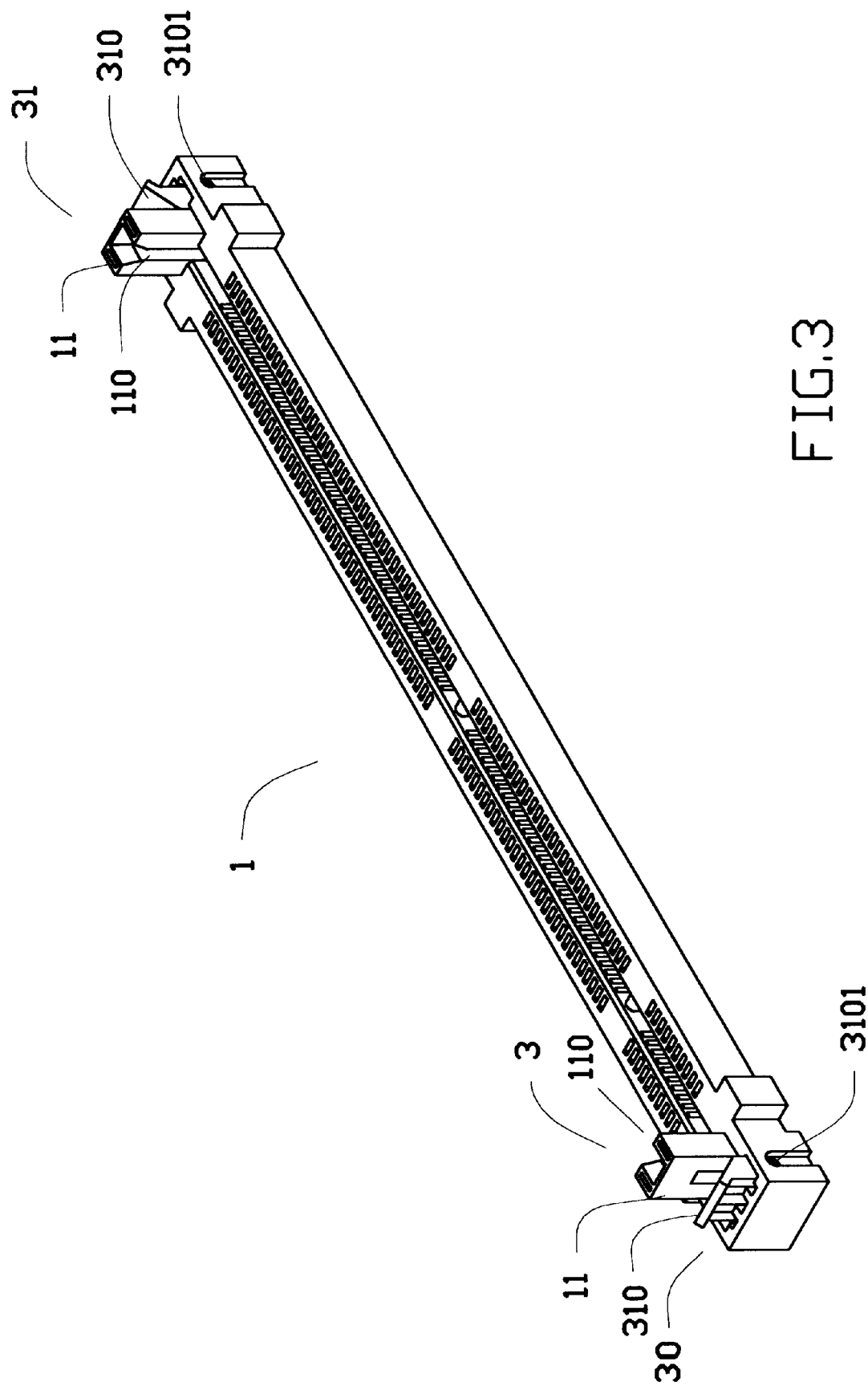
FIG. 3 is an assembled perspective view of the ejector device shown in FIG. 1A.

Reference will now be made in detail to the preferred embodiments of the present invention. It will be noted here that for a better understanding, most of like components are designated by like reference numerals throughout the various figures in the embodiments.

Referring to FIG. 1A, there is shown an ejector device 3 for an electrical connector and the associated electrical connector 1 according to a preferred embodiment of the present invention. The connector 1 mainly comprises an elongate insulating housing 10 defining a longitudinal direction, a plurality of conductive contacts 2 received in the insulating housing 10, and a pair of ejector devices 3 provided on both longitudinal ends of the housing 10.

The elongate insulating housing 10 comprises a central slot 101 extending along the longitudinal direction thereof for receiving a daughter board (not shown). A plurality of passageways 102 are provided on both longitudinal lateral walls (not labeled) of the central slot 101 for receiving the contacts 2 therein. As can be seen in FIG. 1A, each of the contacts 2 includes a soldering section 20 bent outward from a bottom of the housing 10.

The insulating housing 10 further comprises a pair of U-shaped posts 11 formed on the longitudinal ends thereof. Each of the U-shaped posts 11 defines a vertical groove 110 facing inward of the housing 10 for holding the daughter board (not shown) by a lateral edge thereof. The vertical groove 110 includes a diverged upper opening (not labeled) defined by three slant surfaces for guiding the insertion of the daughter board.

A pair of boardlocks 12 are provided on a bottom of the housing 10 near the longitudinal ends for locking the connector 1 onto a mother board (not shown). Each of the boardlocks 12 comprises an upper fixing section 120 for interferingly fixing itself into the housing 10 and a lower inserting leg 121 for insertion into a fixing hole of the mother board.

Each of the ejector devices 3 comprises a positioning structure 30 formed on one longitudinal end of the housing 10 and an ejector lever 31 pivotalbly positioned on the positioning structure 30.

The positioning structure 30 comprises a cavity 300 in a longitudinal end portion of the housing 10. The cavity 300 is defined by an outer portion 304 of the U-shaped post 11 and a pair of opposite lateral walls 305 and an end wall 306 of the housing 10. The pair of opposite lateral walls 305 and the end wall 306 of the housing 10 are integrally and continuously formed at the end of the housing 10 with the outer portion 304 as a rigid structure.

A vertical aperture 303 is defined in the outer portion 304 of each of the U-shaped vertical posts 11. The vertical aperture 303 communicates between the central slot 101 and the cavity 300 and aligns with the central slot 101 for extending therethrough of an ejecting arm 311 of the ejector lever 31 into the central slot 101. The ejecting arm 311 will be described in detail later.

The positioning structure 30 also comprises a pair of pivoting holes 301 formed on the opposite lateral walls 305 and a pair of parallel vertical bars 3021 formed on an inner surface of the end wall 306. The top surface of the vertical bar 3021 is flush with a top surface of the housing 10. A central guiding space 3024 is defined between the pair of vertical bars 3021. A lateral guiding space 3025 is defined between each of the vertical bars 3021 and the corresponding lateral wall 305.

A guiding groove 3011 is formed on each of the opposite lateral walls 305 of the housing 10 for guiding the insertion of a pivoting lug 3101 of the ejector lever 31. Each of the guiding groove 3011 includes a diverged upper opening (not labeled) defined by three slant surfaces for guiding the entrance of the pivoting lug 3101. The pivoting lugs 3101 will be described in detail later.

The positioning structure 30 also comprises a support formation 302 extending upward from a bottom of the cavity 300 for the ejector lever 31. The support formation 302 includes a top cylindrical surface 3022 for pivotably supporting the ejector lever 31 and a slit 3023 formed in a bottom thereof for receiving the boardlock 12.

The ejector lever 31 comprises an upper pushing plate 310 obliquely extending outward and upward, a lower L-shaped ejecting arm 311 extending downward from a lower end of the pushing plate 310, and a pair of support arms 312 extending downward of both lateral edges of the pushing plate 310.

The L-shaped ejecting arm 311 includes an upper vertical portion extending downward from the pushing plate 310 and a lower horizontal portion continuously extending inward into the central slot 101. The lateral edges of the upper vertical portion of the L-shaped ejecting arm 311 are integrally formed with respective inward edges of the support arms 312.

Each of the support arms 312 comprises a cylindrical pivoting lug 3101 projecting laterally from a lower portion thereof for pivotably positioning in the corresponding pivoting hole 301 of the positioning structure 30.

An outward facing open space 3102 is defined between the pushing plate 310 and the pair of support arms 312. A stopper 3103 is formed on outward surfaces of the ejecting lever 31 and the pushing plate 310 in the open space 3102 for being stopped by the end wall 306. A guiding space 3105 is defined between the stopper 3103 and each of the lateral support arms 312. The stopper 3103 defines a concave bottom surface 3104 conforming to the top cylindrical surface 3022 of the support 302 for being pivotably supported by the support formation 302 of the positioning structure 30.

When the ejector lever 31 is being mounted onto the positioning structure 30, the L-shaped ejecting arm 311 is first extended into the vertical aperture 303 and the positioning lugs 3101 of the support arms 312 are next aligned with and guided by the enlarged upper opening of the guiding grooves 3011 of the positioning structure 30 and then are pressed along the guiding grooves 3011 downward to the locations of the pivoting holes 301. Meanwhile, the concave bottom surface 3104 of the stopper 3103 is snugly ridden on and pivots around the top cylindrical surface 3022 of the support 302.

Since the distance between distal free ends of the pivoting lugs 3101 is smaller than the distance between outer rim portions of the enlarged upper openings of the guiding grooves 3011 yet larger than the distance between inner surfaces of the guiding grooves 3011 and the support arms 312 of the ejector lever 31 is adapted to be elastically deflected, the positioning lugs 3101 will be compressed towards each other while they are pressed downward along the guiding grooves 3011, and are then pivotably received in the pivoting holes 301 and return to their original shapes when they reach and enter the pivoting holes 301.

After the ejector lever 31 is mounted onto the positioning structure 30 of the housing 10, the ejector lever 31 pivots the positioning lugs 3101 between a first angular position and a second angular position relative to the positioning structure 30, as shown in FIGS. 2A and 2B, respectively.

When a daughter board (not shown) is inserted into the central slot 101 of the housing 10, the ejector lever 31 is substantially in the first angular position relative to the positioning structure 30. In this position, the ejector lever 31 is in an upright position, the inner edges of the support arms 312 abut against the outer surface 304 of the vertical post 11, the lower portion of the L-shaped ejecting arm 311 lies horizontally below an inner bottom of the central slot 101 without touching the daughter board received in the central slot 101, and the pushing plate 310 is slanted in a steep slope.

When a user wants to remove the daughter board received in the central slot 101 of the housing 10, the pushing plate 310 of the ejector lever 31 is pushed outward to the second angular position relative to the positioning structure 30 so that the pushing plate 310 is in a moderate slope and outward edges of the support arms 312 abut against the end wall 306. In this position, the ejector lever 31 is inclined, the inner edges of the support arms 312 is away from the outer surface 304 of the vertical post 11, the lower portion of the L-shaped ejecting arm 311 tilts and rises at an distal end thereof into the central slot 101 pushing the daughter board upward.

The width of the stopper 3103 of the ejector lever 31 is the same as that of the central guiding space 3024 of the end wall 306. The width of the guiding space 3105 of the ejector lever 31 is the same as that of the vertical bar 3021 of the end wall 306. The thickness of the support arm 312 of the ejector lever 31 is the same as that of the lateral guiding space 3025 of the end wall 306. Therefore, when the ejector lever 31 pivots from the first position to the second position relative to the positioning structure 30, the stopper 3103 enters the central guiding space 3024 and abuts against the end wall 306, the support arms 311 enter the corresponding lateral guiding spaces 3025 and abuts against the end wall 306, and, the guiding spaces 3105 snugly receive the corresponding vertical bars 3021.

Since the outer portion 304 of the U-shaped post 11, the opposite lateral walls 305 of the housing 10, and the end wall 306 of the housing 10 are formed integrally and continuously, a rigid positioning structure 30 is provided one end of the housing 10. In addition, the strength of the positioning structure 30 is further enhanced due to the support formation 302 formed in the cavity 300 between the opposite lateral wall 305. Moreover, since the lateral edges of the upper vertical portion of the L-shaped ejecting arm 311 are integrally formed with respective inward edges of the support arms 312, the ejector lever 31 has a higher strength than the conventional ejector levers.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

I claim:

1. An electrical connector, comprising:

an elongate insulating housing defining a central slot extending along a longitudinal direction thereof for receiving a circuit board;

a plurality of conductive contacts received in a plurality of passageway defined in the insulating housing;

a positioning structure formed on an end of the insulating housing and including a supporting formation having a top cylindrical surface; and at least one ejector device provided on a longitudinal end of the housing including an upper pushing plate, a lower ejecting arm extending downward from a lower end of said pushing plate, and a pair of support arms extending downward of both lateral edges of the pushing plate and formed integrally with inward lateral edges of the ejecting arm for pivotably supporting the ejector lever relative to the positioning structure, a stopper being formed on outward surfaces of the ejecting arm, said stopper including a bottom concave surface corresponding to said top cylindrical surface of said supporting formation of said positioning structure.

2. The electrical connector as claimed in claim 1, wherein said positioning structure comprises a cavity defined by a pair of opposite lateral walls and an end wall integrally and continuously formed at the end of the insulating housing for receiving the ejector lever.

3. The electrical connector as claimed in claim 2, further comprising a pair of U-shaped posts formed on the longitudinal ends of the housing for holding the entrance of the circuit board, each of said U-shaped posts defining a vertical aperture communicating between the central slot and the cavity of the positioning structure for extending therethrough of the ejecting arm of the ejector lever into the central slot.

4. The electrical connector as claimed in claim 2, wherein said ejector lever comprises a pair of positioning lugs pivotably received in a pair of positioning holes formed on the opposite lateral walls of the positioning structure.

5. The electrical connector as claimed in claim 2, wherein said end wall further comprises a pair of vertical bars formed on an inner surface thereof, defining a central guiding space therebetween for guiding the stopper and a lateral guiding space with each of the opposite lateral walls of the positioning structure for guiding the support arms.

6. The electrical connector as claimed in claim 1, wherein said support formation further comprises a slit formed in a bottom thereof for receiving a boardlock.

7. The electrical connector as claimed in claim 1, wherein said pushing plate of the ejector lever is slant for facilitating pushing.

\* \* \* \* \*